(12) United States Patent
 Jin

(10) Patent No.: US 9,478,567 B1
(45) Date of Patent: Oct. 25, 2016

(54) THIN-FILM TRANSISTOR, ARRAY SUBSTRATE AND DISPLAY APPARATUS

(71) Applicants:Shanghai AVIC OPTO Electronics Co., Ltd., Shanghai (CN); Tianma Micro-electronics Co., Ltd., Shenzhen (CN)

(72) Inventor: Huijun Jin, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/006,643

(22) Filed: Jan. 26, 2016

(30) Foreign Application Priority Data

Apr. 16, 2015 (CN) .......................... 2015 1 0181337

(51) Int. Cl.
 *H01L 29/10* (2006.01)
 *H01L 27/12* (2006.01)
(52) U.S. Cl.
 CPC ......... *H01L 27/1255* (2013.01); *H01L 27/124* (2013.01); *H01L 27/1225* (2013.01); *H01L 27/1248* (2013.01)

(58) Field of Classification Search
 CPC .......... H01L 27/1255; H01L 27/1225; H01L 27/124; H01L 27/1248
 USPC ........................................................... 257/43
 See application file for complete search history.

(56) References Cited

U.S. PATENT DOCUMENTS 9,182,641 B2 \* 11/2015 Lan ................... G02F 1/136286

FOREIGN PATENT DOCUMENTS

| CN | 102983132 A | 3/2013 |
| CN | 104240658 A | 12/2014 |

\* cited by examiner

*Primary Examiner* — Tu-Tu Ho
(74) *Attorney, Agent, or Firm* — Anova Law Group, PLLC

(57) ABSTRACT

A thin-film transistor (TFT) array substrate is provided. The thin-film transistor (TFT) array substrate comprises a substrate having at least a display region; and a plurality of bottom-gated thin-film transistors formed over the substrate. The thin-film transistor (TFT) array substrate also includes a plurality of scan lines and a plurality of data lines formed over the substrate in the display region and defining a plurality of sub-pixels, wherein a plurality pre-reserved blank regions are configured among the scan lines, the data lines and the plurality of sub-pixels; and a gate driver circuit formed over the substrate in the display region and disposed in the pre-reserved blank regions in the display region.

20 Claims, 12 Drawing Sheets

THIN-FILM TRANSISTOR, ARRAY SUBSTRATE AND DISPLAY APPARATUS

CROSS-REFERENCES TO RELATED APPLICATIONS

This application claims the priority of Chinese patent application No. 201510181337.1, filed on Apr. 16, 2015, the entirety of which is incorporated herein by reference.

BACKGROUND

Currently, to achieve light-weight and ultra-thin display products, a gate driver on array (GOA) technology is often used to design the scan driver circuit for display panels. The GOA technology integrates the gate switch circuit on an array substrate to form a progressive scan driver for the display panels. The GOA technology would be used to replace the conventional design using individual gate drivers in integrated circuits (ICs).

FIG. 1 illustrates an existing gate driver circuit. As shown in FIG. 1, amorphous silicon gate driver circuit (a-Si shift region, ASG) 100 is usually disposed at one side or both sides of the display region 101 of the array substrate. Thus, a relatively large portion of the edge region of the display panel is occupied. However, the current mainstream design of display products requires minimizing the edge region.

FIG. 2 illustrates a schematic layout of various elements of a gate driver circuit 1000 on a substrate. In general, the gate driver circuit 1000 includes a-Si shift register (ASG) bus lines 111, an ASG capacitor 112, and ASG TFT devices 113, etc. In a prior art design, the ASG capacitor 112 includes a two electrode plates. A gate metal layer 112b and a source and drain metal layer 112a are usually used as the two electrode plates of the ASG capacitor 112. However, because the gate metal layer 112b and/or the source and drain metal layer 112a are typically made of opaque material, the opaque ASG capacitor 112 would affect the transmittance of the edge region of the display panel. When an ultraviolet light is used to cure the frame sealant on the edge region of the display panel during a packaging process, because the ASG capacitor region is opaque, the frame sealant is often not entirely cured.

Further, the devices of the gate driver circuit (ASG) are usually disposed in the non-display region of the array substrate, and a relatively large space is occupied. Therefore, it is more difficult to achieve a narrow edge design, or an edgeless design for display products.

The disclosed methods and systems are directed to solve one or more problems set forth above and other problems.

BRIEF SUMMARY OF THE DISCLOSURE

One aspect of the present disclosure includes providing a thin-film transistor (TFT) array substrate. The thin-film transistor (TFT) array substrate comprises a substrate having at least a display region; and a plurality of top-gated thin-film transistors formed over the substrate. The thin-film transistor (TFT) array substrate also includes The thin-film transistor (TFT) array substrate comprises a substrate having at least a display region; and a plurality of bottom-gated thin-film transistors formed over the substrate. The thin-film transistor (TFT) array substrate also includes a plurality of scan lines and a plurality of data lines formed over the substrate in the display region and defining a plurality of sub-pixels, wherein a plurality of pre-reserved blank regions are configured among the scan lines, the data lines and the plurality of sub-pixels; and a gate driver circuit formed over the substrate in the display region and disposed in the pre-reserved blank regions in the display region.

Another aspect of the present disclosure includes providing a display panel. The display panel comprises at least the disclosed thin-film transistor (TFT) array substrate.

Another aspect of the present disclosure includes providing a display apparatus. The display apparatus comprises at least the disclosed display panel.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 5:
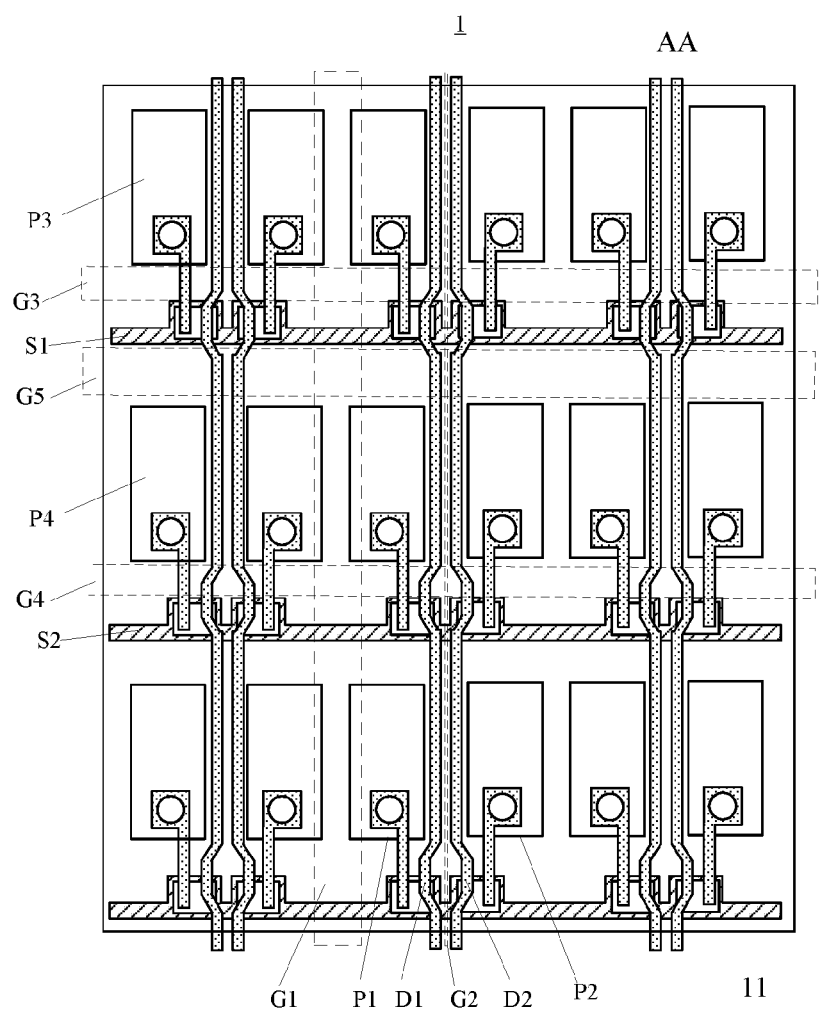
FIG. 5 illustrates an exemplary thin-film transistor (TFT) array substrate consistent with the disclosed embodiments.
Figure 6:
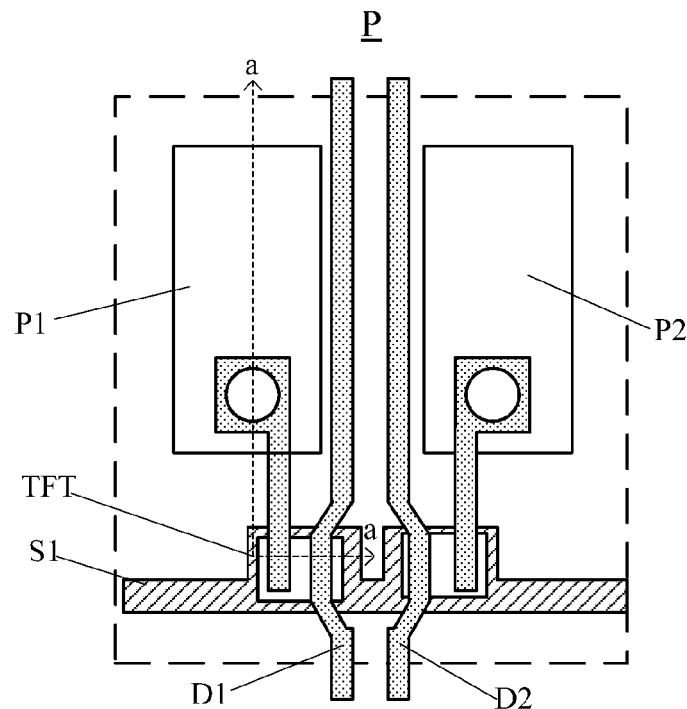
FIG. 6 illustrates an exemplary pixel cell "P" of the exemplary TFT array substrate consistent with the disclosed embodiments.
Figure 7:
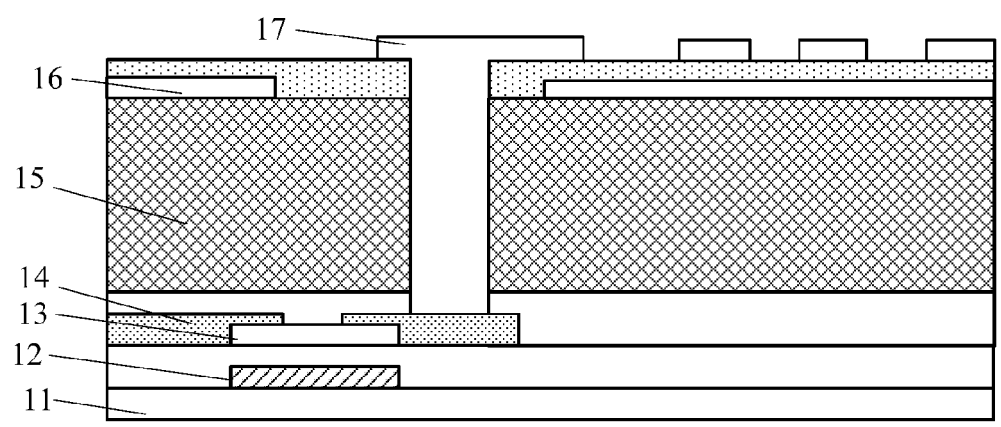
FIG. 7 illustrates a cross-sectional view of the structure illustrated in FIG. 6 along the line "aa"

According to the disclosed embodiments, a thin-film transistor (TFT) array substrate is provided. FIGS. 5~7 illustrate a corresponding TFT array substrate 1. FIG. 5 illustrates an exemplary TFT array substrate 1 consistent with the disclosed embodiments; FIG. 6 illustrates an exemplary pixel cell "P" of the TFT array substrate 1 illustrated in FIG. 5; and FIG. 7 illustrates a cross-sectional view of the structure illustrated in FIG. 6 along the line "aa".

As shown in FIG. 5, the TFT array substrate 1 may include a substrate 11. The substrate 11 may include a display region AA and a non-display region (not labeled). A plurality of data lines D, such as D1, D2, . . . , etc.; and a plurality of scan lines S, such as S1, S2, etc., may be formed over the substrate 11. A plurality of pixel cells (not labeled) may be formed on the substrate 11, as defined by the data lines D and the scan lines S. For example, the pixel cells may be formed at the intersection between the data lines D and the scan lines S. Each of the pixel cells may include two or more sub-pixels, and individual pixels, such as a first pixel P1, a second pixel P2, a third pixel P3, . . . , etc., may be connected to the data lines and/or the scan lines. That is, the plurality of scan lines and the plurality of data lines may cross over to define a plurality of sub-pixels.

The spaces between the plurality of sub-pixels are configured as pre-reserved blank regions. Specifically, the spaces between adjacent pixel cells along the direction of the data lines D may be configured as pre-reserved blank regions; and the spaces between two sub-pixels along the data lines D may be also be configured as pre-reserved blank regions. Further, the TFT array substrate 1 may also include a gate driver circuit (not shown in Figure). Devices of the gate driver circuit of the TFT array substrate 1 may be disposed in the pre-reserved blank regions of the display region AA of the substrate 11. In one embodiment, the gate driver circuit having TFT transistors made of amorphous silicon may be referred as an a-Si shift register (ASG).

FIG. 6 illustrates an exemplary pixel cell (pixel unit) "P" of the plurality of pixel cells of the TFT array substrate 1. As shown in FIG. 6, each of the first pixel cells "P" may include a first sub-pixel P1 and an adjacent second sub-pixel P2; and a first data line D1 and an adjacent second data line D2. The first data line D1 and the adjacent second data line D2 may be in between the first sub-pixel P1 and the second sub-pixel P2. Further, the first sub-pixel P1 and the second sub-pixel P2 may be connected to the first data line D1 and the second data line D2, respectively. Specifically, the pixel electrode of the first sub-pixel P1 may be connected to the first data line D1 through the corresponding source and drain regions of TFTs. When the first sub-pixel P1 is at the displaying condition, the first data line D1 may transmit display data signals to the first sub-pixel P1.

Further, as shown in FIGS. 5~6, because the first data line D1 and the second data line D2 may be disposed adjacent to each other, there may be no data line disposed between the adjacent pixel cells. Thus, a first pre-reserved blank region G1 may be disposed between the adjacent pixel cells along the direction of the data lines. That is, the space between adjacent pixel cells may be configured as first pre-reserved blank regions G1. The first pre-reserved blank regions G1 is shown as the dashed frame in FIG. 5. A first pre-reserved blank region G1 may be reserved for disposing the devices of the gate drive circuit Further, as shown in FIGS. 5~6, although the first data line D1 and the second data D2 may be disposed adjacent to each other, to dispose devices of the gate driver circuit in the display region AA, the distance between the first data line D1 and the second data line D2 may need to be increased. Thus, a second pre-reserved blank region G2 along the data line direction may be disposed between the adjacent first data line D1 and the second data line D2. The second pre-reserved blank region G2 is also shown as the dashed frame in FIG. 5. The second pre-reserved blank region G2 may also be reserved for disposing the devices of the gate drive circuit.

Further, as shown in FIG. 5, the plurality of pixel cells may be disposed on the substrate as an array, i.e. with a predetermined number of rows and a predetermined number of columns. The plurality of sub-pixels in a same row in the display region AA may be connected to a same scan line. Further, the plurality of sub-pixels different rows, such as the third sub-pixels P3 and the adjacent fourth sub-pixel P4, may be connected to a first scan line S1 and a second scan line S2, respectively, and the first scan line S1 may be disposed between the third sub-pixel P3 and the fourth sub-pixel P4. That is, the first scan line S1 and the second scan line S2 may be separated with a predetermined distance.

Further, as shown in FIG. 5, a third pre-reserved region G3 may be disposed between the first scan line S1 and the third sub-pixel P3 (i.e., the subpixel connected to the first scan line S1) along the scan line direction. A fourth pre-reserved blank region G4 may be disposed between the second scan line S2 and the fourth sub-pixel P4 (i.e., the subpixel not connected to the first scan line S1) along the scan line direction. A fifth pre-reserved blank region G5 may be disposed between the first scan line S1 and the fourth sub-pixel P4 along the scan line direction. The third pre-reserved blank region G3, the fourth pre-reserved blank region G4 and the fourth pre-reserved blank region G5 may also be reserved for disposing the devices of the gate driver circuit.

The size of the first pre-reserved blank region G1 may be greater than that of the second pre-reserved blank region G2; the size of the fifth pre-reserved blank region G5 may be greater than that of the third pre-reserved blank region G3; the size of the fifth pre-reserved blank region G5 may be greater than that of the fourth pre-reserved blank region G4. Further, because the third pre-reserved blank region G3 and the fourth the pre-reserved blank region G4 may be both disposed between the sub-pixels and the corresponding scan lines, the sizes of the third pre-reserved blank region G3 and the fourth pre-reserved blank region G4 may be about the same.

Therefore, for illustrative purposes, the display region AA of the array substrate 1 may have five pre-reserved blank regions: the first pre-reserved blank region G1, the second pre-reserved blank region G2, the third pre-reserved blank region G3, the fourth pre-reserved blank region G4, and the fifth pre-reserved blank region G5. The devices of the gate driver circuit (ASG) may be disposed in one or more of the pre-reserved blank regions. In certain other embodiments, the display region AA of the TFT array substrate 1 may have other appropriate numbers of the pre-reserved blank region used for disposing the devices of the gate drive circuit.

FIG. 7 illustrates a cross-sectional view of the structure illustrated in FIG. 6 along the line "aa". As illustrated in FIGS. 6~7. The TFT array substrate 1 includes the substrate 11. The substrate 11 provides a base for the device structures of the TFT array substrate 1. A gate metal layer 12 may be formed on the substrate 11. A semiconductor layer 13 may be formed over the gate metal layer 12. Further, a source and drain metal layer 14 may be formed over the semiconductor layer 13. Further, a source and drain metal layer 14 may be formed over the gate metal layer 12. Further, a common electrode layer 16 may be formed on the source and drain metal layer 14. Further, a pixel electrode layer 7 may be formed over the common electrode 16.

Devices of the gate driver circuit may be disposed in the pre-reserved blank regions. To avoid the effect of the gate driver circuit in operation to the TFT array substrate 1 during the displaying process, the common electrode layer 16 may be used to cover the devices of the gate driver circuit. The common electrode layer 16 may block the interference signals from the devices of the gate driver circuit.

Further, referring to FIG. 7, to better prevent the interference signals from the devices of the gate driver circuit (ASG) from affecting the TFT array substrate 1 when the TFT array substrate 1 is in operation, a first non-conducting dielectric layer 15 may be formed between the source and drain metal layer 14 and the common electrode layer 16. The first non-conducting dielectric layer 15 may be a passive layer, or an organic film layer, etc. The passive layer may be made of silicon nitride, or silicon oxide, etc. Further, to ensure the complete elimination of the interference signal, it may require the thickness of the first non-conducting dielectric layer 15 to be in a range of approximately 0.8 um~5 um. Within such a thickness range, the thicker the first non-conducting dielectric layer 15 is, the better the shielding effect to the interference signal is. From the manufacturing point of view, in one embodiment, the optimal thickness range of the passive layer or the organic film layer may be in a range of approximately 2 um~3 um. Within such a thickness range, the interference signal may be entirely shielded. Meanwhile, the thickness of the first non-conducting dielectric layer 15 may be as desired; and may not cause the entire TFT array substrate 1 to be significantly large such that it may be unable to match the miniaturization requirements.

Further, as shown in FIG. 7, the semiconductor layer 13 may be formed over the gate metal layer 12. Therefore, the TFT may be referred as a bottom-gated TFT because the gate structure of the TFT is disposed below the semiconductor layer 13 of the TFT. For illustrative purposes, bottom-gated TFTs are used to describe the present disclosure.

The semiconductor layer 13 may be made of any appropriate material. In one embodiment, the semiconductor layer 13 is made of amorphous silicon (a-Si), or indium zinc tin oxide (IGZO). The performance of the TFT made of a-Si or IGZO may have a desired performance. Further, the manufacturing processes of the TFTs may be simple.

Figure 1:
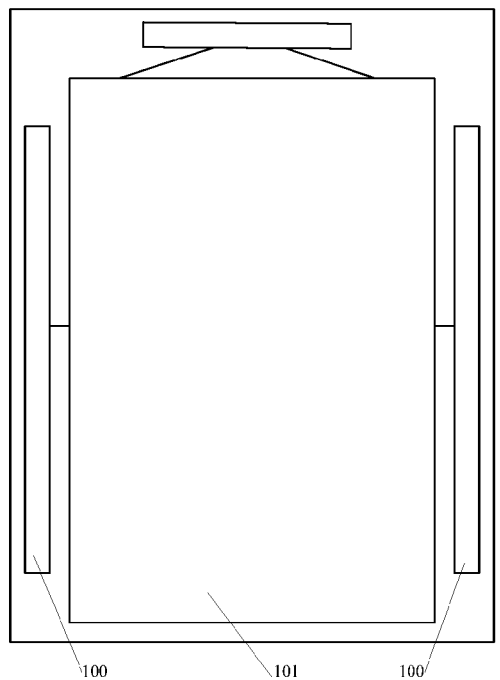
FIG. 1 illustrates an existing gate driver circuit.
Figure 2:
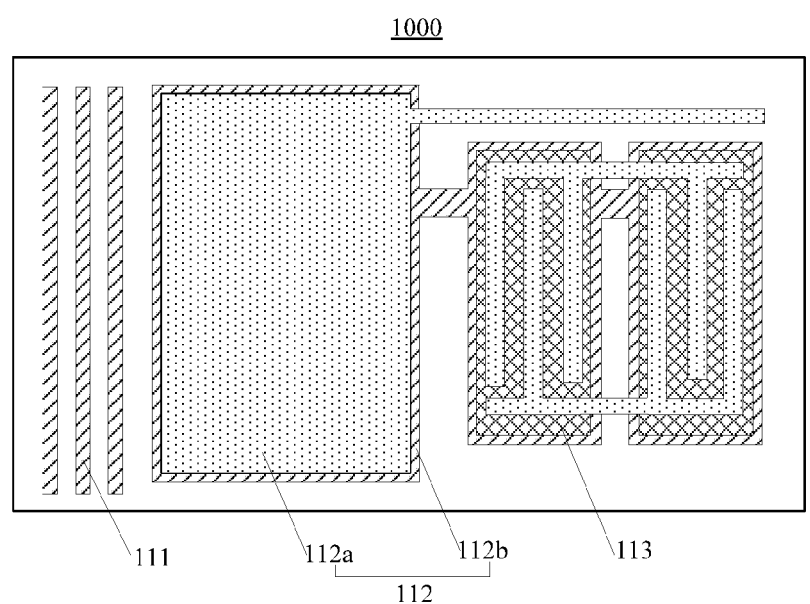
FIG. 2 illustrates another existing gate driver circuit.
Figure 3:
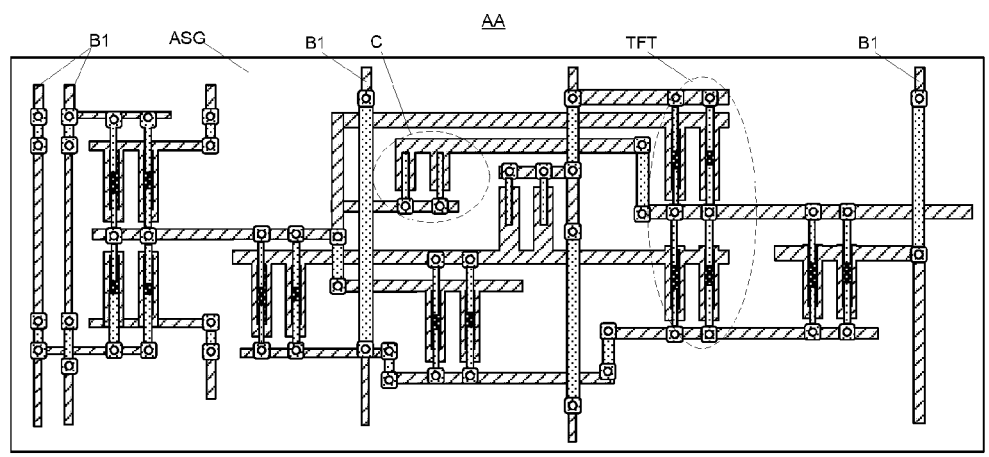
FIG. 3 illustrates an exemplary gate driver circuit consistent with the disclosed embodiments.
Figure 4:
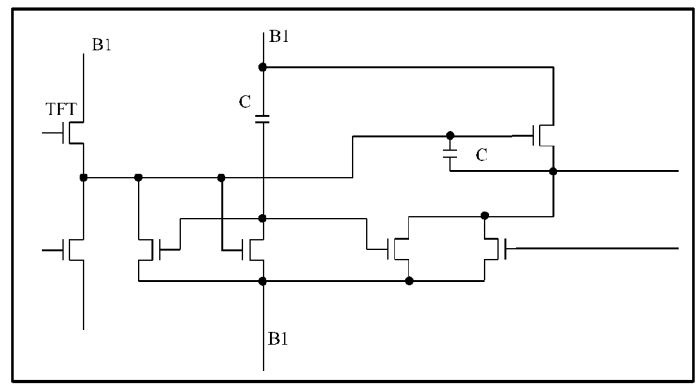
FIG. 4 illustrates an exemplary equivalent circuitry diagram of the gate driver circuit illustrated in FIG. 3.

FIG. 3 illustrates an exemplary gate drive circuit (ASG) of the TFT array substrate 1 disposed in the display region of the substrate 11. FIG. 4 illustrates an exemplary equivalent circuitry diagram of the gate driver circuit (ASG) illustrated in FIG. 3.

As shown in FIG. 3~4, the gate driver circuit (ASG) may include a plurality of gate driver devices. In one embodiment, the gate driver circuit (ASG) may include at least a plurality of signal control lines B1, a plurality of bottom-gated TFTs, and a plurality of capacitors C, etc. In certain other embodiments, the type and number of the devices in the gate drive circuit (ASG) may be any other appropriate combinations.

In one embodiment, the TFTs of the gate driver circuit (ASG) may also be bottom-gated TFTs. The semiconductor layer of the TFTs of the gate driver circuit (ASG) may be made of any appropriate material. In one embodiment, amorphous silicon (a-Si) is used as the semiconductor layer of the TFTs of the gate driver circuit (ASG). The gate drive circuit with TFTs having the semiconductor layer made of a-Si may be integrated on the array substrate 1, thus it may be referred as an a-Si shift register (ASG). The function of the gate driver circuit (ASG) may include turning on or turning off the scan lines one by one repeatedly, and transmitting the logic status of input terminals to output terminals after each clock period. In the gate driver circuit (ASG), the signal control lines B1 may include start trigger voltage lines (STV lines), clock lines (CK lines), voltage high lines (VGH lines), voltage low lines (VGL lines), reset lines, and forward/backward lines (FW/BW lines), etc.

The capacitors C of the gate driver circuit (ASG) may be parallel-plate capacitors. The capacitors C may be used to store and release charges.

In one embodiment, the gates, the sources, the drains, and the semiconductor layers of the TFTs of the gate driver circuit (ASG) may be formed in a same film layer with the components of the TFTs in the corresponding sub-pixels. Further, the gate driver circuit (ASG) may also include diode-type TFTs (not shown in FIG. 3 or FIG. 4). The diode-type TFTs may be formed by short-circuiting the gates and the sources, or the drains and the sources of the TFTs.

Further, referring to FIG. 3 and FIG. 5, the gate driver circuit (ASG) may be disposed in the pre-reserved blank regions of the display region AA of the TFT array substrate 1. The pre-reserved blank regions may provide enough space in the display region AA to dispose the devices of the gate driver circuit (ASG). Thus, it may not need to dispose the gate driver circuit (ASG) in the non-display region of the TFT array substrate 1. Therefore, a narrow edge design, or an edgeless design of the TFT array substrate 1 may be achieved.

Figure 8:
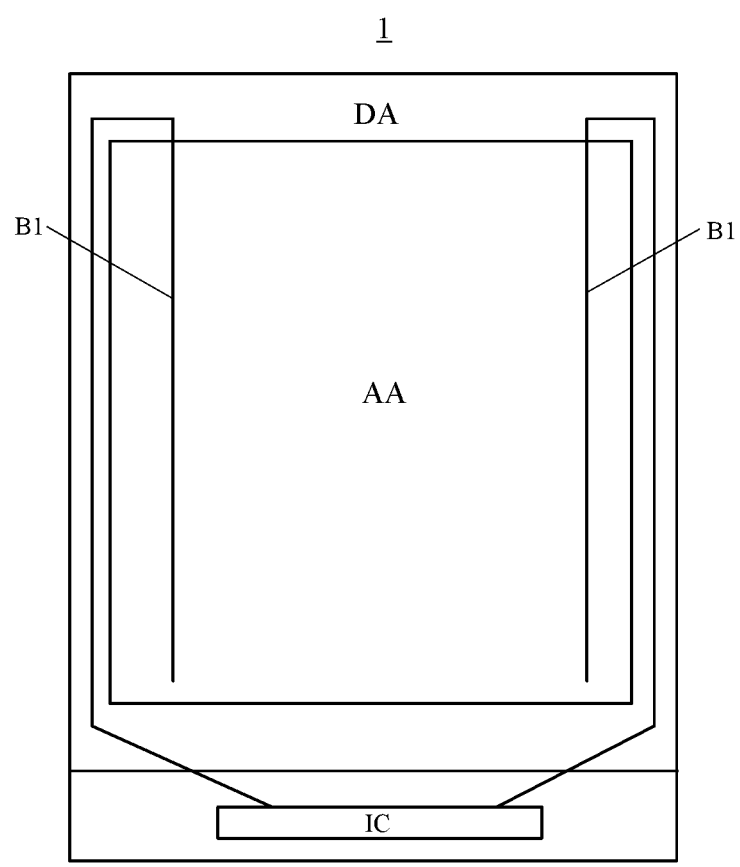
FIG. 8 illustrates an exemplary layout of control signal lines of the gate driver circuit on a TFT array substrate consistent with the disclosed embodiments.

FIG. 8 illustrates an exemplary layout of the control lines B1 of the gate driver circuit (ASG) on the TFT array substrate 1 according to the disclosed embodiments. As shown in FIG. 8, because one end of the signal control line B1 of the gate driver circuit (ASG) may be connected to a driver integrated circuit (IC) in the non-display region DA of the TFT array substrate 1, a portion of the signal control line B1 may be disposed around the peripheral region of the display region AA. The other portion of the of the signal control line B1 connecting to other devices may be disposed in the display region AA of the TFT array substrate 1.

Figure 9:
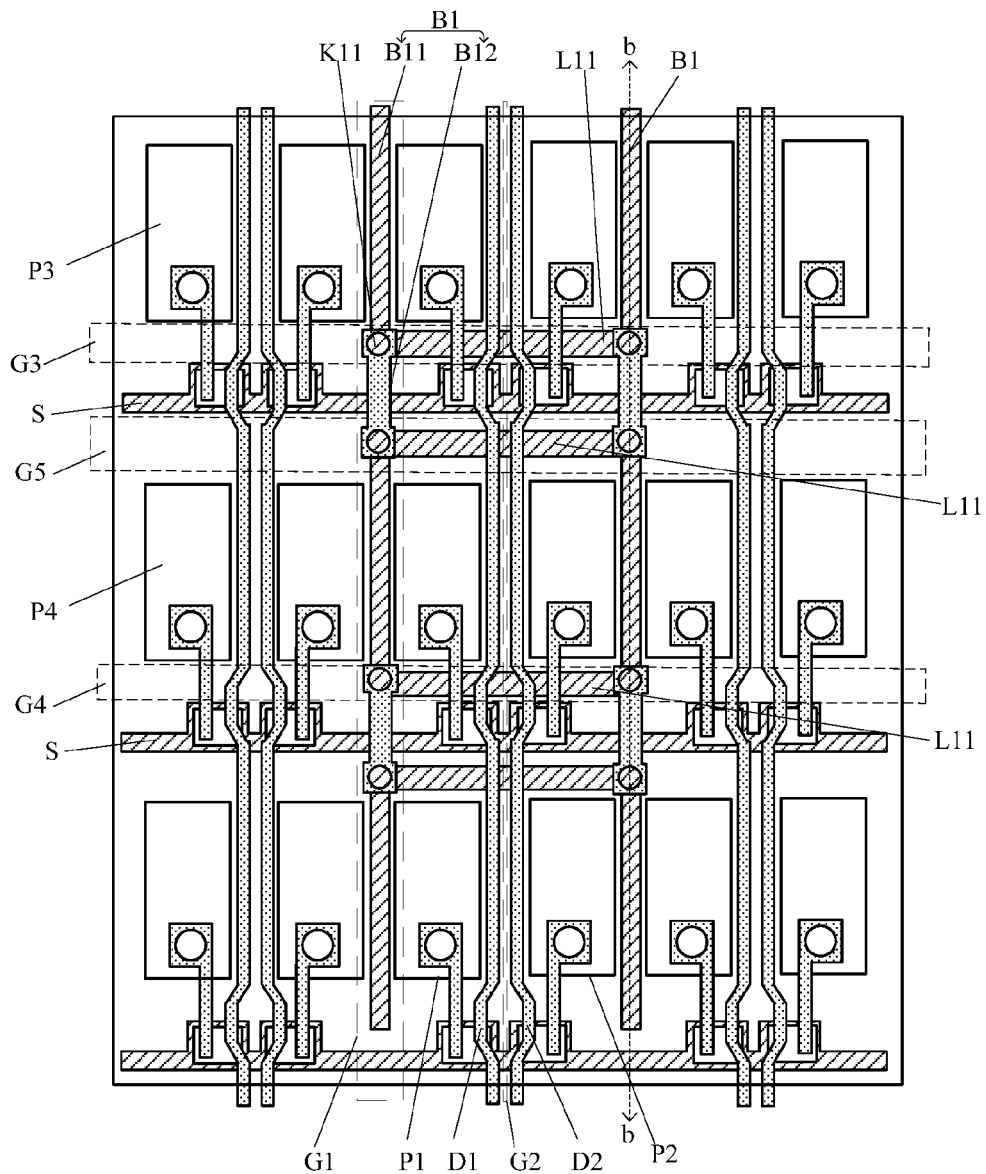
FIG. 9 illustrates another exemplary layout of control signal lines of the gate driver circuit on a TFT array substrate consistent with the disclosed embodiments.
Figure 10:
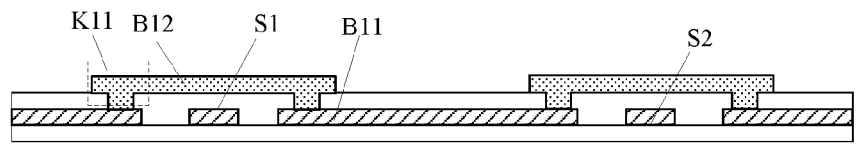
FIG. 10 illustrates a cross-sectional view of the structure illustrated in FIG. 9 along the line "bb"

The detailed layout of the signal control line B1 in the display region AA is illustrated in FIGS. 9~10. FIG. 10 is the cross-sectional view of the layout illustrated in FIG. 9 along the line "bb".

As shown in FIG. 9, the signal control line B1 may be disposed in the first pre-reserved blank region G1. Further, the signal control line B1 may extend along the direction of data line D1 and the data line D2, and cross over a scan line S with an insulation.

The signal control line B1 may include a first signal wiring B11 and a second signal wiring B12. The major portion of the signal control line B1, i.e., the first signal wiring B11, may be formed by patterning the gate metal layer 12 (Referring to FIG. 7). The bridging connection portion of the signal control line B1, i.e., the second signal wring B12, may be formed by patterning the source and drain metal layer 13 (referring to FIG. 7). Thus, the second signal wiring B12 may be disposed on the same layer with the data lines D.

Further, the first signal wiring B11 may be disposed in a same layer with the scan lines D. To cross over the scan line S with an insulation, it may need a plurality of second signal wirings B12 to connect a plurality of first signal wirings B11 to form a complete signal control line B1.

Further, as illustrated in FIG. 10, because the first signal wiring B11 and the second signal wiring B12 may be disposed in different metal layers, it may need a first through-hole structure K11 to electrically connect the first signal wiring B11 with the second signal wiring B12. The first signal wiring B11 may cross over the scan line S with an insulation in a same layer through the bridging structure (the second signal wiring B12).

Further, other different kinds of metal wires may also be disposed in the limited space of the TFT array substrate 1. Because the width of the first pre-reserved region G1 along the direction of the scan line S may be relatively small, the width of the control signal line B1 along the direction of the scan line S may have to be relatively small, while the length of the first pre-reserved blank region G1 along the direction of the data lines D may be relatively large. Thus, a signal control line B1 having a single wire structure may have a relative large resistance. The relatively large resistance of the signal control line B with a single wire structure may cause a signal transmission delay.

To overcome the relatively large resistance in the signal control line B1 caused by utilizing the single wire structure, the devices of the gate driver circuit (ASG) may include a signal control line group. The signal control line group may include at least two single signal control lines B1. The at least two signal control lines B1 may be disposed in different first pre-reserved blank regions G1, and may be electrically connected in parallel. The use of the plurality of single signal control lines B1 connected in parallel may lower the total resistance of the group of signal control lines B1; and may reduce the signal transmission delay. Because the plurality of single signal control lines B1 may be electrically connected in parallel, the signal on each signal control line B1 may the same.

Further, as illustrated in FIG. 9, the plurality of single signal control lines B1 may be connected in parallel by a plurality of first connecting wirings L11. In one embodiment, to simplify the manufacturing process, and reduce the production cost, the first connecting wiring L11 may be formed by patterning the gate metal layer 12. Therefore, the first connecting wirings L11 may be directly connected to the corresponding signal control lines B1, and no additional bridging structures may be needed. Accordingly, the layout of the first connecting wirings L11 may be simplified. In certain other embodiments, the first connecting wirings L11 may be formed by patterning other metal layers, such as the source and drain metal layer 14, etc., as long as the plurality of single signal control wirings L11 may be able to electrically connect the plurality of signal control lines B1 in parallel.

Moreover, considering the optimization of the layout of metal wires, the first connecting wirings L11 may be disposed in parallel with the data lines D. That is, the first connecting wirings L11 and the corresponding signal control line B1 may cross over on a same layer for a direct connection. Further, the first connecting wiring L11 may be disposed in the third pre-reserved blank region G3, the fourth pre-served blank region G4, and the fifth pre-reserved blank region G5, etc. The number of the first connecting wirings L11 for the optimized resistance of signal control line B1 may be dependent on the practical requirements.

Figure 11:
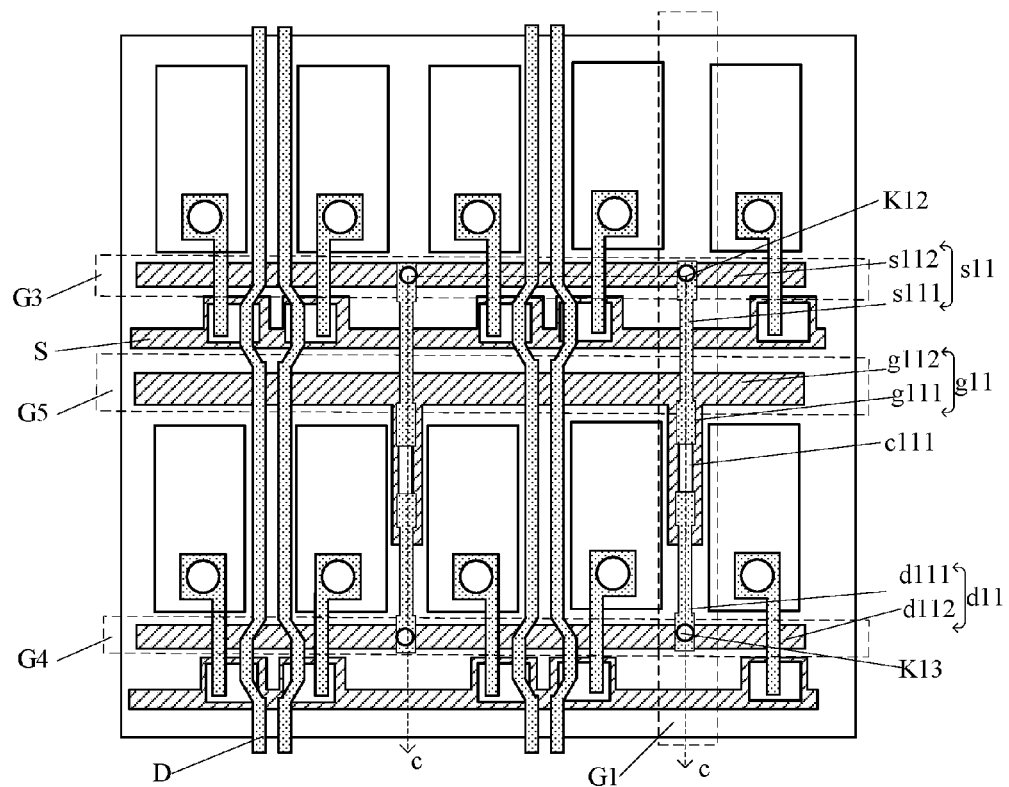
FIG. 11 illustrates an exemplary layout of TFTs of the gate driver circuit in pre-reserved blank regions consistent with the disclosed embodiments.
Figure 12:
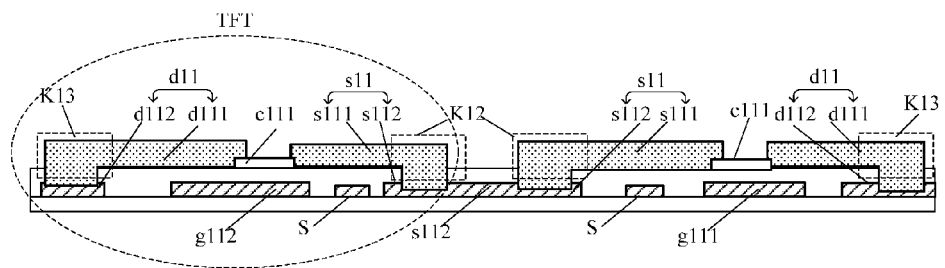
FIG. 12 illustrates the cross-sectional view of the structure illustrated in FIG. 11 along the line "cc"

FIGS. 11~12 illustrate an exemplary layout of the TFTs of the gate driver circuit (ASG) in the pre-reserved blank regions of the display region AA consistent with disclosed embodiments. FIG. 12 is a cross-sectional view of the structure illustrated in FIG. 11 along the line "cc".

As shown in FIGS. 11~12, the TFT of the gate driver circuit (ASG) may include a gate g11, a first semiconductor c111, a source s11, and a drain d11. The gate g11 may include a first gate wiring g111 disposed in parallel with the gate line D; and a second gate wiring g112 disposed in parallel with the scan line S. The first gate wiring g111 may be the major portion of the gate g11. The second gate wiring g112 may be used to electrically connect the gate g11 with external signals, and/or the gate structure of other TFTs.

The first gate wiring g111 and the second gate wiring g112 may be disposed in the first pre-reserved blank region G1 and the fifth pre-reserved blank region G5, respectively. Further, in one embodiment, the gate g11 and the scan line S may be disposed in a same layer; and may be formed by patterning the gate metal layer 12. The first gate wiring g111 and the second gate wiring g112 may be formed from a same metal layer. Thus, the first gate wiring g111 and the second gate wiring g112 may be connected directly; and the fabrication process may be relatively simple.

In certain other embodiments, the gate g11 may be disposed in other appropriate pre-reserved blank regions. For example, the gate g11 may be disposed only in the third pre-reserved blank region G3, only in the fourth pre-reserved blank region G4, in both the third pre-reserved blank region G3 and the first pre-reserved blank region G1, or in both the fourth pre-reserved blank region G4 and the first pre-reserved blank region G1, etc.

The first semiconductor c111 may face the major portion of the gate g11, i.e., the first gate wiring g111. Thus, it may need the first semiconductor c111 and the first gate wiring g111 to be deposed in a same region. In one embodiment, the first semiconductor c111 is disposed in the first pre-reserved region G1. Further, as shown in FIG. 7 and FIG. 12, the first semiconductor c111 may be disposed in a same layer with the semiconductor of the TFTs of the sub-pixels. Thus, the first semiconductor c111 the semiconductor of the TFTs of the sub-pixels may be formed by patterning the semiconductor layer 13.

Further, as shown in FIGS. 11~12, the source s11 may include a first source wiring s111 and a second source wiring S112. The first source wiring S111 may be disposed in parallel with the data lines D; and the second source wiring s112 may be disposed in parallel with the scan lines S. The first source wiring s111 may be the major portion of the source s11. The second source wiring s112 may connect the source s11 with other devices, such as the external control signals, and the sources of other TFTs, etc.

Referring to FIG. 7 and FIG. 12, the first source wiring s111 may be formed by patterning the source and drain metal layer 14. Because the source s11 may be required to form an Ohmic contact with the first semiconductor c111, the projection view of the first source wiring s111 on the substrate 11 may have an overlap with the first semiconductor c111; and the first source wiring s111 may be disposed in the first pre-reserved region G1. Moreover, the second source wiring s112 may be used to connect the source S11 with the external signals, etc. For example, as illustrated in FIG. 3 and FIG. 4, the second source wiring s112 may be connected to the signal control line B1.

To avoid a complicated layout caused by the line change-over structures, etc., the second source wiring s112 may be disposed in the same layer with the signal control line B1. In one embodiment, the second source wiring s112 may be formed by patterning the gate metal layer 12. Furthermore, to achieve an electrical connection between the second source wiring s112 and the signal control line B1, as shown in FIG. 11, the second source wiring s112 may be disposed to be perpendicular to the signal control line B1. Specifically, the second source wiring s112 may be disposed in the third pre-reserved blank region G3.

Further, as illustrated in FIG. 11 and FIG. 12, because the first source wiring s111 and the second source wiring s112 may be disposed in different layers, to achieve an electrical connection between the first source wiring s111 and the second source wiring s112, a second through-hole structure K12 may be used. The second through-hole structure K12 may be disposed in the overlapping region of the first source wiring s111 and the second source wiring s112. In one embodiment, the second through-hole structure K12 may be disposed in the overlapping region of the first pre-reserved blank region G1 and the third pre-reserved blank region G3.

Further, as shown in FIGS. 11~12, the drain d11 may include a first drain wiring d111 and a second drain wiring d112. The first drain wiring d111 may be disposed in parallel with the data lines D; and the second drain wiring d112 may be disposed in parallel with the scan lines S. The first drain wiring d111 may be the major portion of the drain d11; and the second drain wiring d112 may be used to connect the drain 11 to other devices, such as external control signals, and/or the drains of other TFTs, etc.

Referring to FIG. 7 and the FIG. 12, the first drain wiring d111 may be formed by patterning the source and drain metal layer 14. Because it may require the drain d11 to form an Ohmic contact with the first semiconductor c111, the projection view of the first drain wiring d111 on the substrate 11 may have a predetermined overlap with the first semiconductor c111. In one embodiment, the first drain wiring d111 may be disposed in the first pre-reserved region G1.

The second drain wiring d112 may be used to connect the first drain wiring d111 to the external signals, etc. For example, as illustrated in FIG. 3 and FIG. 4, the second drain wiring d112 may be connected to the signal control line B1. To avoid a complicated layout caused by line changeover structures, etc., in one embodiment, the second drain wiring d112 may be disposed on the same layer with the signal control line B1; and may be formed by patterning the gate metal layer 12.

Furthermore, as shown in FIG. 11, to achieve an electrical connection between the second drain wiring d112 and the signal control line B1, the second drain wiring d112 may be disposed to be perpendicular to the signal control line B1; and may cross over the signal control line B1 in the same layer to achieve a direct connection. Specifically, in one embodiment, the second drain wiring d112 may be disposed in the fourth pre-reserved blank region G4.

Further, as shown in FIG. 12, because the first drain wiring d111 and the second drain wiring d112 may be disposed in different layers, a third through-hole structure K13 may be used to achieve an electrical connection between the first drain wiring d111 and the second drain wiring d112. Moreover, the third through-hole structure K13 may be disposed in the overlapping region of the first drain wiring d111 and the second drain wiring d112. In one embodiment, the third through-hole structure K13 may be disposed in the overlapping region of the first pre-reserved blank region G1 and the fourth pre-reserved blank region G4.

For TFTs, the function and the location of the sources and the drains may be interchangeable under normal circumstances. Therefore, in one embodiment, the disposition methods and the positions of the source s11 and the drain d11 may be interchangeable.

Further, as illustrated in FIG. 11 and FIG. 12, in one embodiment, the gate driver circuit (ASG) may include at least a TFT group. The TFT group may include a plurality of TFTs. The plurality of the TFTs may be disposed in different pre-reserved blank regions; and may be electrically connected in parallel. Further, the plurality of TFTs may be all bottom-gated TFTs. For illustrative purposes, two TFTs of the gate driver circuit (ASG) are shown in FIG. 11 and FIG. 12. The gates g11, the sources s11 and the drains d11 may be electrically connected in parallel. Specifically, the two gates g11 of the two TFTs may be electrically connected by the corresponding second gate wiring g112. The two sources s11 of the two TFTs may be electrically connected through the corresponding second source wirings s112. The two drains d11 of the two TFTs may be directly connected Similar as forming the plurality of signal control lines into a group, forming a plurality of TFTs into a group; and electrically connecting the plurality of TFTs in parallel may reduce the resistance of the TFTs. If the resistance of TFTs is significantly large, the TFTs may not be turned on due to the slow response rate, or not high enough threshold voltage. Thus, the performance of the TFTs may be affected. Accordingly, it may cause picture delays when the array substrate is displaying. Therefore, disposing a plurality of TFTs connected in parallel may reduce the electric resistance to overcome picture delays, etc.

The plurality of TFTs may be electrically connected in parallel. Therefore, the signal applied on each TFT may be the same.

Further, the gate driver circuit (ASG) may also include diode-type TFTs. Basically, the diode-type TFTs may be formed by short-circuiting the gates of the TFTs and the corresponding sources, or the gates of the TFTs and the corresponding drains.

Figure 13:
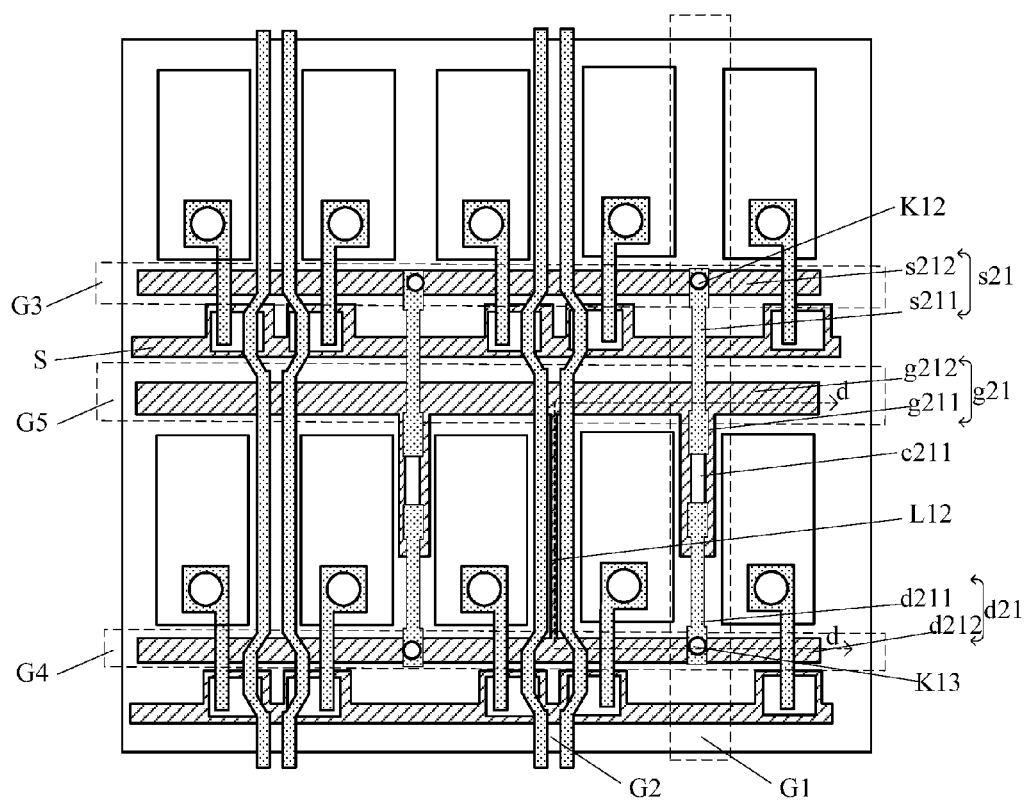
FIG. 13 illustrates an exemplary layout of diode-type TFTs of the gate driver circuit in pre-reserved blank regions consistent with the disclosed embodiments.
Figure 14:
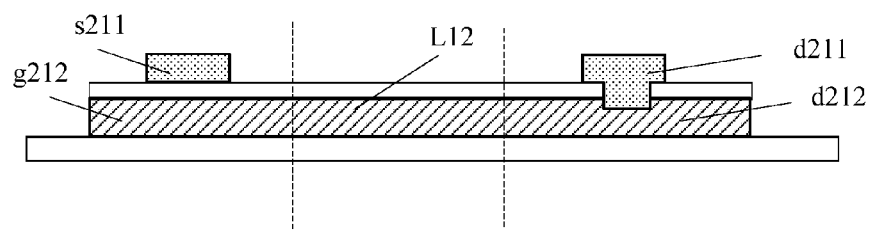
FIG. 14 illustrates the cross-sectional view of the structure illustrated in FIG. 13 along the line "dd"

FIGS. 13~14 illustrate an exemplary layout of diode-type TFTs of the gate driver circuit (ASG) in the pre-reserved blank regions of the display region AA. FIG. 14 illustrates a cross-sectional view of the structure illustrated in FIG. 13 along the line "dd".

As shown in FIGS. 13~14, in one embodiment, the diode type TFTs may be based on previously described TFTs. The detailed structures and layout of the gate g21, including the first gate wiring g211 and the second gate wiring g212; the source s21, including the first source wiring s211 and the second source wiring s212; the drain d21, including the first drain wiring d211 and the second drain wiring d212, and the first semiconductor c211 may be similar with the layout described in FIGS. 11~12. The major differences may include followings.

As described previously, the diode-type TFT may be formed by short-circuiting the source and the gate of a TFT, or short-circuiting the drain and the gate of a TFT. For illustrative purposes, diode-type TFTs formed by short-circuiting the drains and the gates may be described.

As shown in FIGS. 13~14, the gate g21 and the drain d21 are short-circuited by a second connecting wiring L12. Specifically, the second connecting wiring L12 may be formed in the second pre-reserved blank region G2 by patterning the gate metal layer 12; and may be extended to connect the second gate wiring g212 and the second drain wiring d212. Further, as illustrated in FIG. 14, the second connecting wiring L12, the second gate wring g212 and the second drain wiring d212 may locate on the same metal layer; and may belong to an integral structure. Therefore, the second connecting wiring L12 may be directly connected with the corresponding gate g21 and the corresponding drain d21; and it may not need to form a bridging structure. Accordingly, the layout of metal wires may be simplified.

In certain other embodiments, the second connecting wiring L12 may be formed by patterning of other metal layers, such as the source and drain metal layer 14, etc. Further, the second connecting wiring L12 may be disposed in other pre-reserved blank regions, such as the first pre-reserved blank region G1, etc., as long as the electrical connection between the gate g21 and the drain d21 may be achieved.

In certain other embodiments, the diode type TFTs may be formed by short-circuiting the gates g21 and the drains d21 by a bridging structure. In still certain other embodiments, the diode type TFTs may be formed by the short-circuiting the gate g21 and the drains d21 by a direct connection, or a second connecting wiring.

Further, as illustrated in FIGS. 13~14, in one embodiment, the gate driver circuit (ASG) may include at least a diode-type TFT group. The diode-type TFT group may include a plurality of diode-type TFTs. The plurality of diode-type TFTs may be disposed in different pre-reserved blank regions; and may be electrically connected in parallel. For illustrative purposes, two diode-type TFTs are shown in FIGS. 13~14. The two diode-type TFTs may be electrically connected in parallel. That is, the gates g21 of the diode-type TFTs, the sources s21 of the diode-type TFFs, and the drains d21 of the diode-type TFTs may be electrically connected in parallel. Specifically, the two gates g21 of the two diode-type TFTs may be electrically connected by the corresponding second gate wiring g212; the two sources s21 of the two diode-type TFTs may be electrically connected through the corresponding second source wirings s212; and the two drains d11 of the two diode-type TFTs may be directly connected.

Similar as forming the plurality of signal control lines into a group, forming a plurality of diode-type TFTs into a group; and connecting the TFTs in parallel may further reduce the resistance of the diode-type TFTs. If the resistance of diode-type TFTs is significantly large, the diode-type TFTs may not be turned on due to the slow response rate, or not high enough threshold voltage. Thus, the performance of the diode-type TFTs may be affected. Accordingly, it may cause picture delays when the TFT array substrate is displaying. Therefore, disposing a plurality of diode-type TFTs connected in parallel may reduce the electric resistance to overcome picture delays, etc.

Figure 15:
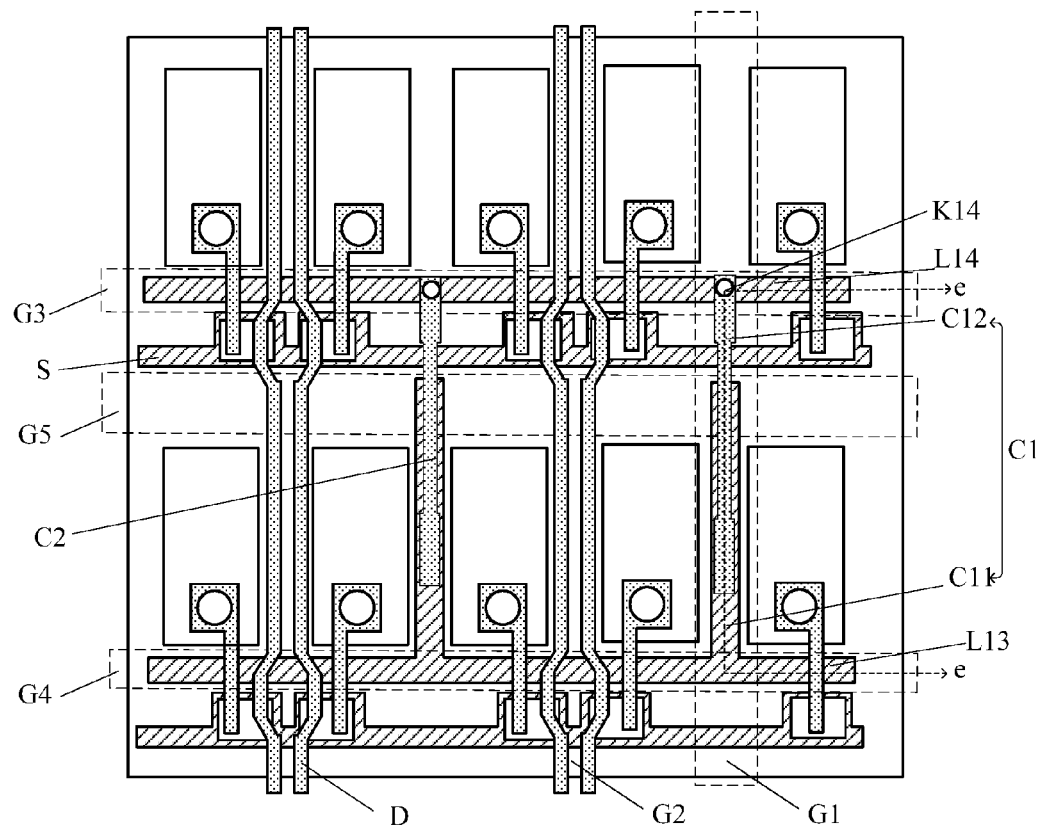
FIG. 15 illustrates an exemplary layout of capacitors of the gate driver circuit (ASG) in pre-reserved blank regions consistent with the disclosed embodiments.
Figure 16:
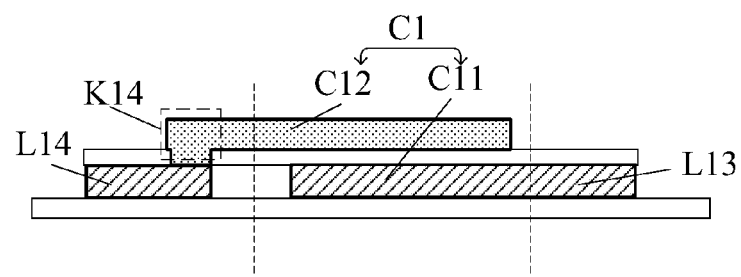
FIG. 16 illustrates the cross-sectional view of the structure illustrated in FIG. 15 along the line "ee"
Figure 19:
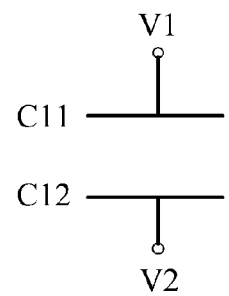
FIG. 19 illustrates an exemplary equivalent circuitry diagram of a capacitor consistent with the disclosed embodiments.

FIGS. 15~16 illustrate an exemplary layout of capacitors of the gate driver circuit (ASG) in the pre-reserved regions of the display region AA consistent with the disclosed embodiments. FIG. 16 is a cross-sectional view of the structure illustrated in FIG. 15 along the line "ee". FIG. 19 illustrates an exemplary equivalent circuitry diagram of a capacitor disposed in the pre-reserved blank region.

The capacitor C in the gate driver circuit (ASG) may be a parallel-plate capacitor. The parallel-plate capacitor may include at least two capacitor electrodes (plates). The plurality of capacitor electrodes may be disposed in different metal layers. The plurality of capacitor electrodes may face each other to function as a capacitor. For illustrative purposes, one capacitor of the gate drive circuit (ASG) is described.

As shown in FIGS. 15~16, a first capacitor C1 may be disposed in the first pre-reserved blank region G1. The first capacitor C1 may include at least a first capacitor electrode C11 and a second capacitor electrode C12. The first capacitor electrode C11 may be formed by patterning the gate metal layer 12; and the second capacitor electrode C12 may be formed by patterning the source and drain metal layer 14. The extension direction of the first capacitor electrode C11 and the second capacitor electrode C12 may be parallel to the data line D.

Further, as illustrated in FIGS. 15~16 and FIG. 19, the first capacitor electrode C11 may be connected to a first voltage V1 through a third connecting wiring L13. To simplify the layout of the metal wires, the third connecting wiring L13 may be disposed on a same layer with the first capacitor electrode C11. That is, the third connecting wiring L13 may also be formed by patterning the gate metal layer 12. Thus, the third connecting wiring L13 and the first capacitor electrode C11 may be directly connected; and it may not need a bridging structure. In certain other embodiments, the third connecting wiring L13 may be formed by patterning other metal layers, such as the source and drain metal layer 14, etc.

Further, as illustrated in FIGS. 15~16 and FIG. 19, the second capacitor electrode C12 may be connected to a second voltage V2 through a fourth connecting wiring L14. To simplify the layout of the metal wires, and enhance the utilization of the gate metal layer 12, the fourth connecting wiring L14 may be formed by patterning the gate metal layer 12. Because the second capacitor electrode C12 may locate in a same layer with the source and drain metal layer 14, an electrical connection between the second capacitor electrode C12 and the fourth connecting wiring L14 may be achieved through the fourth through-hole structure K14. In certain other embodiments, the fourth connecting wiring L14 may be formed by patterning other metal layers, as long as the second capacitor electrode C12 may be connected to the corresponding second voltage V2.

Further, in one embodiment, the third connecting wiring L13 may be disposed in parallel with the scan lines S. Thus, the third connecting wiring L13 may be disposed in the fourth pre-reserved blank region G4. The fourth connecting wiring L14 may be disposed in parallel with the scan lines S. Thus, the fourth connecting wiring L14 may be disposed in the third pre-reserved blank region G3. Therefore, the fourth through-hole structure K14 may be disposed in the overlapping region of the third pre-reserved blank region G3 and the first pre-reserved blank region G1.

Figure 17:
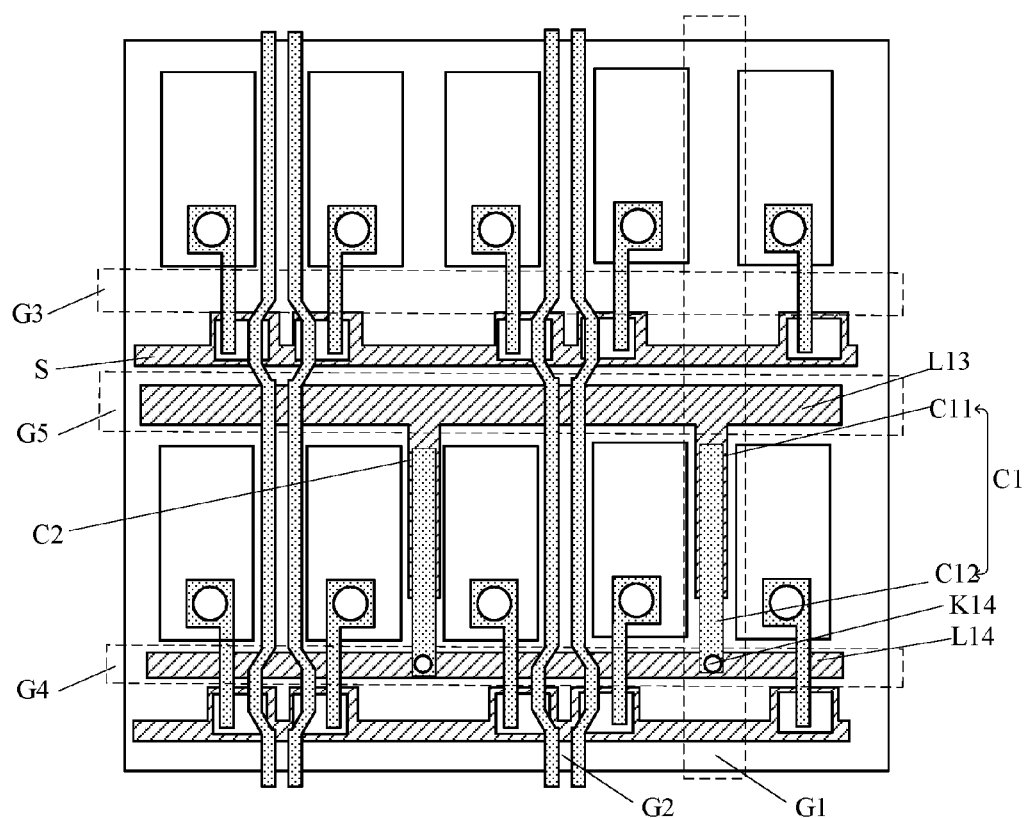
FIG. 17 illustrates another exemplary layout of capacitors of the gate driver circuit in pre-reserved blank regions consistent with the disclosed embodiments.

FIG. 17 illustrates another exemplary layout of capacitors of the gate driver circuit (ASG) in the pre-reserved regions of the display region AA consistent with the disclosed embodiments. As shown in FIG. 17, the layout of the capacitors in the pre-reserved blank regions may be similar as the layout illustrated in FIGS. 15~16. The major differences may include followings.

As illustrated in FIG. 17, the first capacitor C1 may be disposed in the first pre-reserved blank region G1. Further, the first capacitor C1 may include a first capacitor electrode C11 and a second capacitor electrode C12; and the first capacitor electrode C11 and the second capacitor electrode C12 may face each other. Further, the extension direction of the first capacitor electrode C11 and the second capacitor electrode C12 may be parallel to the data lines D.

Further, the third connecting wiring L13 may be disposed in parallel with the scan line S; and may be disposed in the fifth pre-reserved blank region G5. The fourth connecting wiring L14 may be disposed in parallel with the scan line S; and may be disposed in the fourth pre-reserved blank region G4. Thus, the fourth through-hole structure K14 may be disposed in the overlapping region of the fourth pre-reserved blank region G4 and the first pre-reserved region G1.

In certain other embodiments, the third connecting wiring L13 may be disposed in the third pre-reserved region G3, and/or the fourth connecting wiring L14 may be disposed in the fifth pre-reserved region G5, as long as the third connecting wiring L13 and the fourth connecting wiring may be connected with the first capacitor electrode C11 and the second capacitor electrode 12, respectively.

Figure 18:
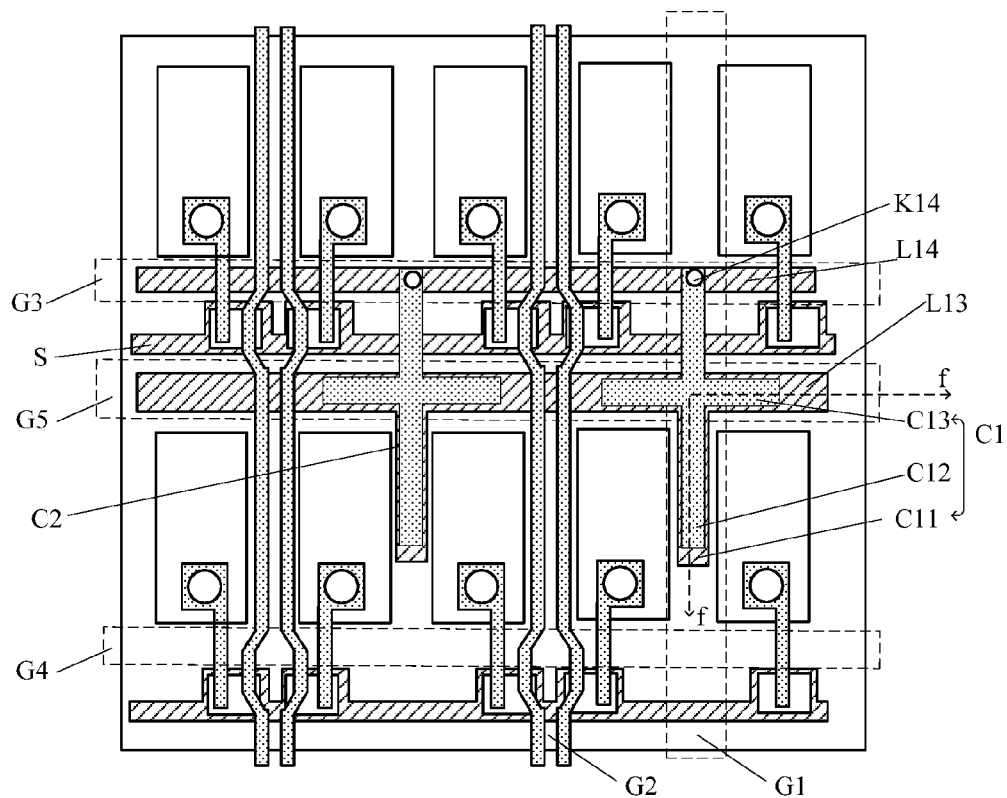
FIG. 18 illustrates another exemplary layout of capacitors of the gate driver circuit in pre-reserved blank regions consistent with the disclosed embodiments.

FIG. 18 illustrates another exemplary layout of the capacitors in the pre-reserved regions of the display region AA consistent with the disclosed embodiments. As shown in FIG. 18, the layout of the capacitors in the pre-reserved regions may be similar as the layout illustrated in FIGS. 15~16. The major differences may include followings.

As shown FIG. 18, the first capacitor C1 may include a first capacitor electrode C11 and a second capacitor electrode C12. The first capacitor electrode C11 and the second capacitor electrode C12 may be disposed in the first pre-reserved blank region G1. The first capacitor electrode C11 may face the second capacitor electrode C12. Further, the second capacitor electrode C12 may include a first extending electrode C13. The first extending electrode C13 may be disposed in the fifth pre-reserved blank region G5; and may be parallel to the fourth connecting wiring L14. The first extending electrode C13 and the second capacitor electrode C12 may be an integral structure; and may be formed by patterning the source and drain metal layer 14.

Specifically, the first capacitor electrode C11 and the third connecting wiring L13 may be disposed in the first pre-reserved blank region G1 and the fifth pre-reserved blank region G5, respectively. The third connecting wiring L13 may be connected to the first capacitor electrode C11. The second capacitor electrode C12 and the fourth connecting wiring L14 may be disposed in the first pre-reserved blank region G1 and the third pre-reserved blank region G3, respectively. The second capacitor electrode C12 and the fourth connecting wiring L14 may be electrically connected through the fourth through-hole structure K14. Moreover, the second capacitor electrode C12 may also include the first extending electrode C13 extending along the scan line S direction. The first extending electrode C13 may face the third connecting line L13; and may be disposed in the fifth pre-reserved blank region G5.

Thus, by disposing the first extending electrode C13, the facing area between the first capacitor electrode C11 and the second capacitor electrode C12 may be increased. Accordingly, the storage capacity of the first capacitor C1 may be increased.

Further, as illustrated in FIGS. 15~18, the gate driver circuit (ASG) may also include at least a capacitor group. Specifically, the capacitor group may include a plurality of capacitors electrically connected in parallel; and disposed in different pre-reserved blank regions.

For illustrative purposes, as shown in FIGS. 15~18, the first capacitor C1 and a second capacitor C2 are shown. The first capacitor C1 and the second capacitor C2 may be electrically connected in parallel. Specifically, the two first capacitor electrodes C11 of the two capacitors may be electrically connected by the third connecting wiring L13; and the two second capacitor electrodes C12 of the two capacitors may be electrically connected through the fourth connecting wiring L14.

Connecting a plurality of capacitors into a group in parallel may increase the storage capacity of the capacitor group. The more capacitors the capacitor group has, the higher the total storage capacity is. The number of capacitors C in the capacitor group may be determined by the required storage capacity in a practical application.

By integrating the gate driver circuit (ASG) and corresponding devices in the display region of the TFT array substrate, the space in the non-display region (edge region) required for disposing the gate driver circuit (ASG) may be saved. Thus, a narrow edge design, or an edgeless design of the TFT array substrate may be achieved.

Figure 20:
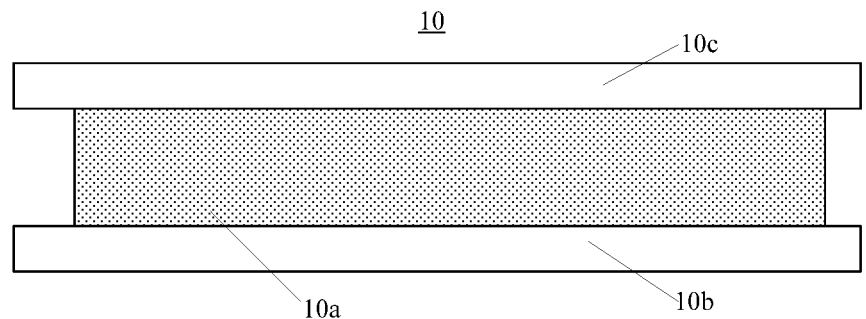
FIG. 20 illustrates an exemplary display panel consistent with the disclosed embodiments.

Further, according to the disclosed embodiments, a display panel is provided. FIG. 20 illustrates an exemplary display panel 10 consistent with the disclosed embodiments.

As illustrated in FIG. 20, the display panel 10 may include at least the disclosed TFT array substrate 10b, a color film substrate 10c, and a display dielectric layer 10a formed between TFT array substrate 10b and the color film substrate 10c.

Figure 21:
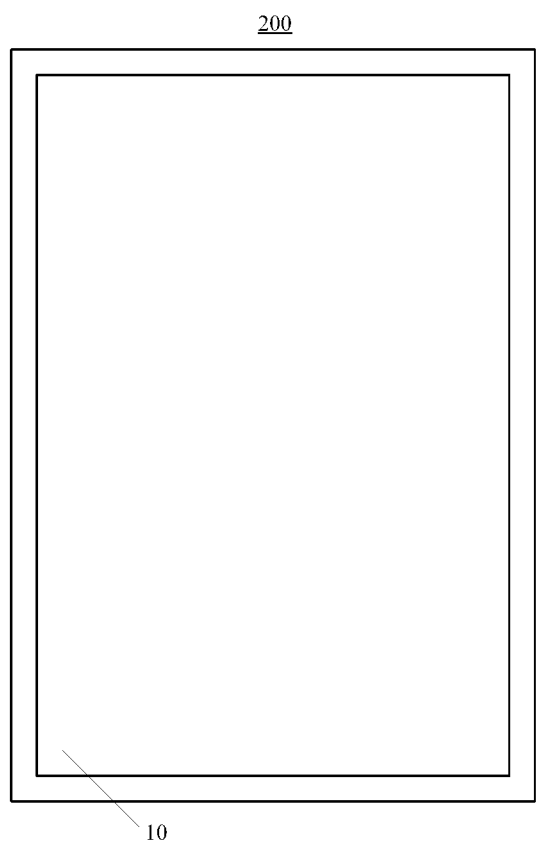
FIG. 21 illustrate an exemplary display apparatus consistent with the disclosed embodiments.

Further, according to the disclosed embodiments, a display apparatus is provided. FIG. 21 illustrates a corresponding display apparatus 200.

As shown in FIG. 21, the display apparatus 200 may include at least the disclosed display panel 10. The display apparatus 200 may be cellphone, tablet, TV, monitor, laptop, digital frame, GPS, and any other products and parts with certain display functions. By integrating the gate driver circuit (ASG) in the display region of the array apparatus, a narrow edge design, or an edgeless design of the display apparatus may be achieved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A thin-film transistor (TFT) array substrate, comprising:
   a substrate having at least a display region;
   a plurality of bottom-gated thin-film transistors formed over the substrate;
   a plurality of scan lines and a plurality of data lines formed over the substrate in the display region and defining a plurality of sub-pixels, wherein a plurality of pre-reserved blank regions are configured among the scan lines, the data line, and the plurality of sub-pixels; and
   a gate driver circuit formed over the substrate in the display region and disposed in the pre-reserved blank regions in the display region.

2. The thin-film transistor (TFT) array substrate according to claim 1, wherein the bottom-gated thin-film transistors further comprises:
   a gate metal layer formed over the substrate;
   a semiconductor layer formed over the gate metal layer; and
   a source and drain metal layer formed over the semiconductor layer.

3. The thin-film transistor (TFT) array substrate according to claim 2, wherein:
   the semiconductor layer is made of one of amorphous silicon and indium gallium zinc oxide.

4. The thin-film transistor (TFT) array substrate according to claim 2, further comprising:
   a first non-conductive dielectric layer formed over the source and drain metal layer;
   a common electrode layer formed over the first non-conductive dielectric layer; and a pixel electrode layer formed over the common electrode layer,
wherein the common electrode also covers the gate drive circuit.

5. The thin-film transistor (TFT) array substrate according to claim 4, wherein:
the non-conductive dielectric layer is made of one of a passive layer and an organic layer;
a thickness of the passive layer is in a range of approximately 0.8 μm~5 μm; and
a thickness of the organic layer is in a range of approximately 0.8 μm~5 μm.

6. The thin-film transistor (TFT) array substrate according to claim 2, wherein the display region further comprises:
a plurality of pixel cells,
wherein:
each of the plurality of pixel cells includes a first sub-pixel and an adjacent second sub-pixel of the plurality of sub-pixels;
a first data line and an adjacent second data of the plurality of data lines are disposed between the first sub-pixel and the second sub-pixel; and
the first sub-pixel and the second sub-pixel are connected to the first data line and the second data line, respectively.

7. The thin-film transistor (TFT) array substrate according to claim 6, wherein the pre-reserved blank regions further comprises:
a first pre-reserved blank region between two adjacent pixel cells, extending along a direction of the data lines; and
a second pre-reserved blank region between the first data line and the second data line;
extending along the direction of the data lines.

8. The thin-film transistor (TFT) array substrate according to claim 7, wherein:
a plurality of sub-pixels in a same row are connected to a same scan line,
wherein the display region further comprises:
a plurality of third sub-pixels of the plurality of sub-pixels and a plurality of adjacent fourth sub-pixels of the plurality of sub-pixels, connecting to a first scan line of the plurality of scan lines and a second scan line of the plurality of scan lines disposed between the first scan lines and the second scan lines, respectively.

9. The thin-film transistor (TFT) array substrate according to claim 8, the pre-reserved blank regions further comprises:
a third pre-reserved blank region disposed between the first scan line and the third sub-pixel region, extending along a direction of the scan lines;
a fourth pre-reserved blank region disposed between the second scan line and the fourth sub-pixel, extending along the direction of the scan lines; and
a fifth pre-reserved blank region disposed between the first scan line and the fourth sub-pixel, extending along the direction of the scan lines.

10. The thin-film transistor (TFT) array substrate according to claim 9, the gate driver circuit further comprises at least:
a signal control line;
a bottom-gated thin-film transistor (TFT); and
a capacitor.

11. The thin-film transistor (TFT) array substrate according to claim 10, wherein:
the control signal line is disposed in the first pre-reserved blank region; and
the control signal line extends along a direction of the data lines and crosses over the scan lines with an insulation.

12. The thin-film transistor (TFT) array substrate according to claim 10, wherein the bottom-gated thin-film transistor further comprises:
a gate formed by patterning the gate metal layer, and disposed in the first pre-reserved blank region;
a first semiconductor facing the gate formed by patterning the semiconductor layer; and disposed in the first pre-reserved blank region;
a source formed by patterning the source and drain metal layer, and disposed in the first pre-reserved region and the third pre-reserved blank region; and
a drain formed by patterning the source and drain metal layer, and disposed in the first pre-reserved region and the fourth pre-reserved region.

13. The thin-film transistor (TFT) array substrate according to claim 12, wherein the gate further comprises:
a first gate wiring disposed in parallel with the date line; and
a second gate wiring disposed in parallel with the scan line,
wherein the first gate wiring and the second gate wiring are disposed in the first pre-reserved blank region and the fifth pre-reserved blank region, respectively.

14. The thin-film transistor (TFT) array substrate according to claim 13, wherein:
the source includes a first source wiring disposed in parallel with the data line and a second source wiring disposed in parallel with the scan line,
wherein:
the first source wiring is formed by patterning the source and drain metal layer, and disposed in the first pre-reserved blank region;
the second source wiring is formed by patterning the gate metal layer, and disposed in the third pre-reserved blank region; and
the first source wiring and the second source wiring are electrically connected through a through-hole structure;
and
the drain includes a first drain wiring disposed in parallel with the data line and a second drain wiring disposed in parallel with the scan line,
wherein:
the first drain wiring is formed by patterning the source and drain metal layer, and disposed in the first pre-reserved blank region;
the second drain wiring is formed by patterning the gate metal layer, and disposed in one of the fourth pre-reserved blank region; and
the first drain wiring and the second drain wiring are electrically connected through a through-hole structure.

15. The thin-film transistor (TFT) array substrate according to claim 10, wherein the gate driver circuit further comprises at least:
a thin-film transistor (TFT) group having a plurality of thin-film transistors (TFTs) connected in parallel, and disposed in different pre-reserved blank regions.

16. The thin-film transistor (TFT) array substrate according to claim 10, wherein the thin film transistor further comprises:
at least a diode-type thin film transistor (TFT) formed by one of short-circuiting the source and the gate of the thin-film transistor (TFT), and short-circuiting the drain and the gate of the thin-film transistor (TFT).

17. The thin-film transistor (TFT) array substrate according to claim 9, wherein the capacitor further comprises:
- a first capacitor electrode formed by patterning the gate metal layer, and disposed in the first pre-reserved blank region; and
- a second capacitor electrode facing the first capacitor electrode formed by patterning the source and drain metal layer, and disposed in the first pre-reserved blank region.

18. The thin-film transistor (TFT) array substrate according to claim 17, wherein:
- the first capacitor electrode and the second capacitor electrode are disposed in parallel with the data line in the first pre-reserved blank region;
- the first capacitor electrode is connected to a first voltage by a third connecting wiring formed by patterning the gate metal layer;
- the second capacitor electrode is connected to a second voltage by a fourth connecting wiring formed by patterning the source and drain metal layer; and
- the second capacitor electrode and the fourth connecting wiring are electrically connected by a through-hole structure.

19. A display panel, comprising:
at least a thin-film transistor (TFT),
wherein the thin-film transistor includes:
- a substrate having at least a display region;
- a plurality of bottom-gated thin-film transistors formed over the substrate;
- a plurality of scan lines and a plurality of data lines formed over the substrate in the display region and defining a plurality of sub-pixels, wherein a plurality of pre-reserved blank regions are configured among the scan lines, the data line, and the plurality of sub-pixels; and
- a gate driver circuit formed over the substrate in the display region and disposed in the pre-reserved blank regions in the display region.

20. A display apparatus, comprising:
at least a display panel having at least a thin-film transistor,
wherein the thin-film transistor comprises:
- a substrate having at least a display region;
- a plurality of bottom-gated thin-film transistors formed over the substrate;
- a plurality of scan lines and a plurality of data lines formed over the substrate in the display region and defining a plurality of sub-pixels, wherein a plurality of pre-reserved blank regions are configured among the scan lines, the data line, and the plurality of sub-pixels; and
- a gate driver circuit formed over the substrate in the display region and disposed in the pre-reserved blank regions in the display region.

* * * * *